United States Patent
Mojumder et al.

(10) Patent No.: US 9,455,026 B2
(45) Date of Patent: Sep. 27, 2016

(54) SHARED GLOBAL READ AND WRITE WORD LINES

(71) Applicant: QUALCOMM Incorporated, San Diego, CA (US)

(72) Inventors: Niladri Narayan Mojumder, San Diego, CA (US); Stanley Seungchul Song, San Diego, CA (US); Zhongze Wang, San Diego, CA (US); Ping Liu, San Diego, CA (US); Kern Rim, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/546,980

(22) Filed: Nov. 18, 2014

(65) Prior Publication Data

US 2016/0141021 A1     May 19, 2016

(51) Int. Cl.
| | |
|---|---|
| *G11C 11/00* | (2006.01) |
| *G11C 11/419* | (2006.01) |
| *G11C 8/14* | (2006.01) |
| *H01L 27/06* | (2006.01) |
| *G11C 8/16* | (2006.01) |

(52) U.S. Cl.
CPC ............ *G11C 11/419* (2013.01); *G11C 8/14* (2013.01); *H01L 27/0688* (2013.01); *G11C 8/16* (2013.01)

(58) Field of Classification Search
USPC .................. 365/154, 63, 230.05, 230.06
See application file for complete search history.

(56) References Cited

U.S. PATENT DOCUMENTS

| | | | |
|---|---|---|---|
| 5,991,224 A * | 11/1999 | Aipperspach | G11C 8/16 365/230.05 |
| 7,024,524 B2 | 4/2006 | Nii | |
| 8,094,491 B2 | 1/2012 | Kitagawa et al. | |
| 8,467,214 B2 | 6/2013 | Funane et al. | |
| 2012/0070944 A1 | 3/2012 | Kim et al. | |
| 2013/0070552 A1* | 3/2013 | Ryu, II | G11C 8/14 365/230.03 |
| 2013/0258757 A1 | 10/2013 | Iyer et al. | |
| 2014/0185364 A1 | 7/2014 | Iyer et al. | |

OTHER PUBLICATIONS

International Search Report and Written Opinion for International Application No. PCT/US2015/057362, ISA/EPO, Date of Mailing Feb. 9, 2016, 9 pages.

* cited by examiner

*Primary Examiner* — Son Dinh
(74) *Attorney, Agent, or Firm* — Toler Law Group, PC (57) ABSTRACT

An apparatus includes an array of bit cells that include a first row of bit cells and a second row of bit cells. The apparatus also includes a first global read word line configured to be selectively coupled to the first row of bit cells and to the second row of bit cells. The apparatus further includes a second global read word line configured to be selectively coupled to the first row of bit cells and to the second row of bit cells. The apparatus also includes a global write word line configured to be selectively coupled to the first row of bit cells and to the second row of bit cells. The first global read word line, the second global read word line, and the global write word line are located in a common metal layer.

30 Claims, 7 Drawing Sheets

SHARED GLOBAL READ AND WRITE WORD LINES

I. FIELD

The present disclosure is generally related to read and write word lines for bit cells.

II. DESCRIPTION OF RELATED ART

Advances in technology have resulted in smaller and more powerful computing devices. For example, there currently exist a variety of portable personal computing devices, including wireless telephones, such as mobile and smart phones, tablets, and laptop computers, which are small, lightweight, and easily carried by users. These devices can communicate voice and data packets over wireless networks. Further, many such devices incorporate additional functionalities such as a digital still camera, a digital video camera, a digital recorder, and an audio file player. Also, such devices can process executable instructions, including software applications, such as a web browser application, that can be used to access the Internet. As such, these devices can include significant computing capabilities.

Electronic devices, such as wireless telephones, may include memories that include a memory array made of one or more memory cells. One type of memory cell that may be used for the memory (e.g., a memory cache) is a 3-port bit cell. A 3-port bit cell may include two read ports and one write port and may be used in static random access memory (SRAM) devices. In 14 nanometer (nm) complementary metal oxide semiconductor (CMOS) technology, a 3-port SRAM bit cell may be manufactured by a two-mask litho-etch-litho-etch (LELE) process using fin field effect transistors (FinFETs) and overlaying of two metal layers, referred to as M1 and M2 layers. The top metal layer, M2, may be patterned in a non-linear fashion and may include "jogs" (e.g., turns). For manufacturing processes less than 14 nm (e.g., 10 nm or 7 nm), self-aligned double patterning (SADP) may be preferable to LELE for forming M1 and M2, due to decreased cost and improved process control (e.g., more precise line width and line spacing control) provided by SADP as compared to LELE. However, SADP may not support non-linear patterns that include jogs.

III. SUMMARY

The present disclosure provides a design that includes an array of bit cells that share common global word lines in a single metal layer. For example, the array of bit cells may include a first bit cell and a second bit cell. The first bit cell may be in a first row of the array of bit cells, and the second bit cell may be in a second row of the array of bit cells. The first row may include two local read word lines and a local write word line. The second row may also include two local read word lines and a local write word line. The local read word lines may be in a second metal layer (M2), and the local write word lines may be in a third metal layer (M3). In a particular example, each bit cell (e.g., each row) may have a width of approximately 132 nm (e.g., approximately twice the contacted poly pitch (CPP) or twice the distance between contacted poly (gate) lines of the bit cell).

A first global read word line, a second global read word line, and a global write word line may be in a common metal layer (e.g., a fourth metal layer (M4)). The pitch of each global word line may be approximately 80 nm. The global word lines may be placed in M4 across the width of the first bit cell and the width of the second bit cell (e.g., a combined width of approximately 264 nm). Row select logic may be coupled to the global word lines to control whether the global word lines are coupled to the first bit cell (e.g., the first row) or to the second bit cell (e.g., the second row). Thus, all of the global word lines may be located in a single metal layer (M4), as opposed to one global word line per metal layer, which may improve routing between different components within the bit cells. For example, a sixth metal layer (M6) and an eighth metal layer (M8) may be relatively open to routing because each global word line is in M4. Additionally, the global word lines may have a relatively large pitch (e.g., 80 nm) which may decrease read/write latency due to decreased word line resistive-capacitive (RC) impedance.

In a particular aspect, an apparatus includes an array of bit cells that include a first row of bit cells and a second row of bit cells. The apparatus also includes a first global read word line configured to be selectively coupled to the first row of bit cells and to the second row of bit cells. The apparatus further includes a second global read word line configured to be selectively coupled to the first row of bit cells and to the second row of bit cells. The apparatus also includes a global write word line configured to be selectively coupled to the first row of bit cells and to the second row of bit cells. The first global read word line, the second global read word line, and the global write word line are located in a common metal layer.

In another particular aspect, a method includes receiving a selection signal at row select logic. The method also includes coupling a first global read word line, a second global read word line, and a global write word line to a first row of bit cells if the selection signal has a first logical value. The method also includes coupling the first global read word line, the second global read word line, and the global write word line to a second row of bit cells if the selection signal has a second logical value. The first global read word line, the second global read word line, and the global write word line are located in a common metal layer.

In another particular aspect, a non-transitory computer-readable medium includes instructions that, when executed by a processor, cause the processor to initiate coupling a first global read word line, a second global read word line, and a global write word line to a first row of bit cells if a received selection signal has a first logical value. The instructions are also executable to cause the processor to initiate coupling the first global read word line, the second global read word line, and the global write word line to a second row of bit cells if the received selection signal has a second logical value. The first global read word line, the second global read word line, and the global write word line are located in a common metal layer.

In another particular aspect, an apparatus includes first means for performing a read operation configured to be selectively coupled to a first row of bit cells and to a second row of bit cells. The apparatus also include second means for performing the read operation configured to be selectively coupled to the first row of bit cells and to the second row of bit cells. The apparatus further includes means for performing a write operation configured to be selectively coupled to the first row of bit cells and to the second row of bit cells. The first means for performing the read operation, the second means for performing the read operation, and the means for performing the write operation are located in a common metal layer.

One particular advantage provided by at least one of the disclosed embodiments is improved routing between different components within bit cells. For example, upper metal layers (M6 and M8) may be relatively open to routing because global word lines (e.g., two read global word lines and one write global word line) are placed in a single metal layer (M4). Additionally, because the global word lines are placed across the width of two bit cells (as opposed to one), the global word lines may have a relatively large width which may decrease read/write latency due to decreased word line RC impedance. Other aspects, advantages, and features of the present disclosure will become apparent after review of the entire application, including the following sections: Brief Description of the Drawings, Detailed Description, and the Claims.

V. DETAILED DESCRIPTION

Scaling down from 14 nm technology may present challenges. For example, for technology nodes 14 nm and larger, the width of a 3-port bit cell may be restricted to being less than or equal to twice contacted poly pitch (CPP, the distance between contacted poly (gate) lines). For 14 nm, CPP may be approximately 80-90 nm. As used herein, cell "width" may be perpendicular to a poly direction and along a fin direction. For technology nodes smaller than 14 nm, CPP is reduced, which results in decreased bit cell width (e.g., a bit cell width of approximately 132 nm). When the bit cell width is reduced (i.e., narrowed), write and read word lines in the bit cell may also be narrowed, resulting in increased read/write latency due to increased word line resistor-capacitor (RC) impedance.

In conventional bit cells, global word lines may be located in a fourth metal layer (M4), a sixth metal layer (M6), and an eighth metal layer (M8). For example, each global word line may have a width of approximately 80 nm, which may result in a single global word line per metal layer. To illustrate, a first global read word line may be located in M4, a second global read word line may be located in M6, and a global write word line may be located in M8. Placing a global word line in M4, M6, and M8 may reduce routing capabilities within the bit cell. For example, routing between different components and layers within the bit cell using M4, M6, and M8 may be degraded because the layers include relatively large global word lines.

To circumvent this problem, the present disclosure provides global word lines (e.g., the first global read word line, the second global read word line, and the global write word line) in a common metal layer (e.g., M4). The pitch of each global word line may be approximately 80 nm, and the global word lines may be placed in the common metal layer across the width of two bit cells (e.g., 132 nm×2=264 nm). Row select logic may be coupled to the global word lines to control whether the global word lines are coupled to a first bit cell (e.g., a first row) or to a second bit cell (e.g., a second row).

Particular embodiments of the present disclosure are described below with reference to the drawings. In the description and the drawings, common features are designated by common reference numbers for clarity of the embodiments as depicted and described.

Figure 1A:
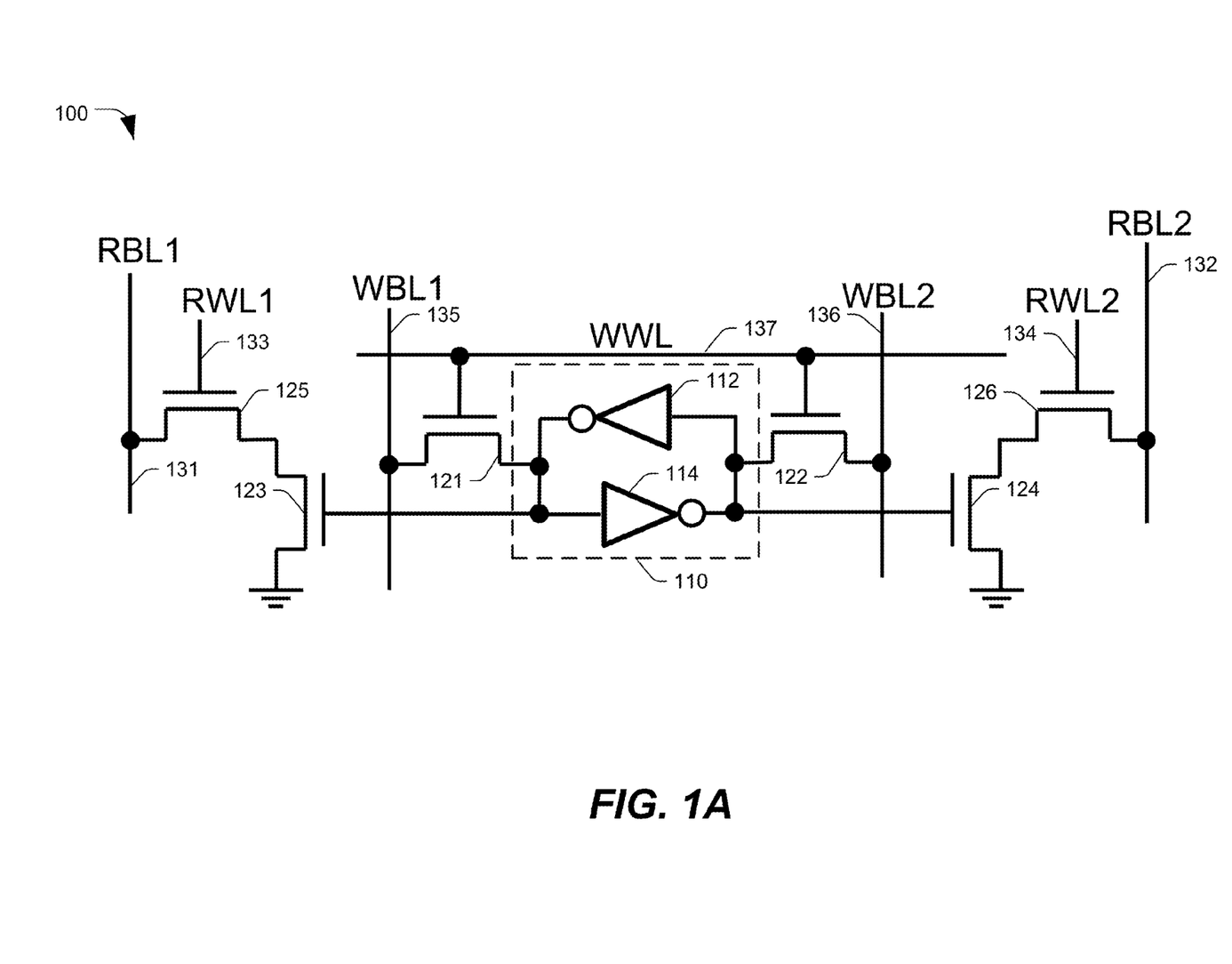
FIG. 1A and FIG. 1B are circuit diagrams of an illustrative embodiment of a 3-port bit cell.
Figure 1B:
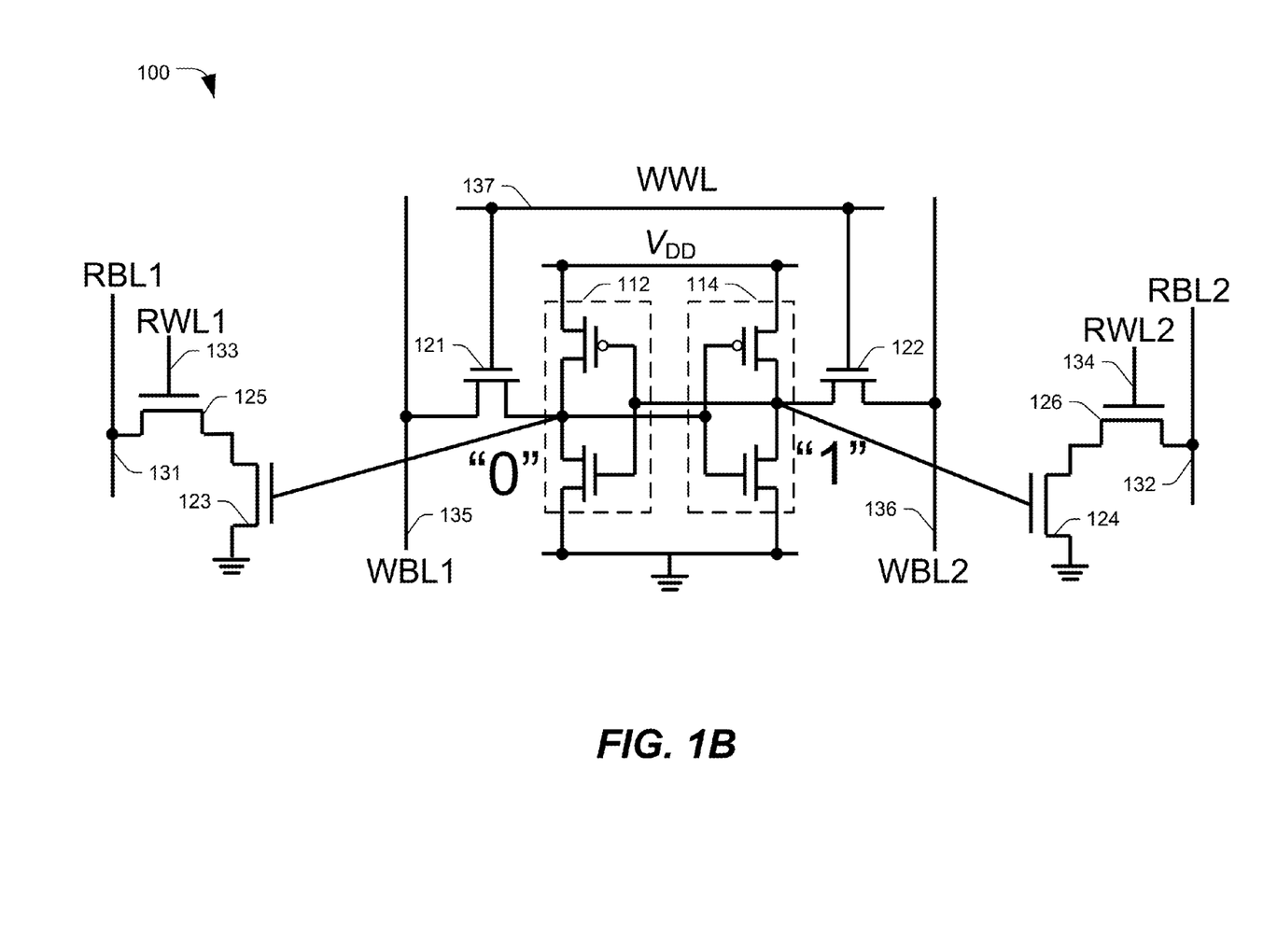

Referring to FIGS. 1A and 1B, circuit diagrams of a first illustrative embodiment of a bit cell 100 are shown. The bit cell 100 includes a storage latch 110. The storage latch 110 may include a pair of cross-coupled inverters 112, 114. Each of the inverters 112, 114 may include a p-type metal oxide semiconductor (PMOS) transistor and an n-type metal oxide semiconductor (NMOS) transistor, as shown in FIG. 1B.

The storage latch 110 may be connected (e.g., coupled) to a first write transistor 121 and to a second write transistor 122. The write transistors 121, 122 may be NMOS transistors, as shown. The first write transistor 121 may be connected to a first write bit line (WBL1) 135 and to a write word line (WWL) 137, and the second write transistor 122 may be connected to a second write bit line (WBL2) 136 and to the write word line (WWL) 137. The first write transistor 121 and the second write transistor 122 may be complementary write transistors of a write port of the bit cell 100. The write port may be used to write a logic zero (e.g., low) value into the storage latch 110 when the write word line 137 and one of the write bit lines 135 or 136 is asserted. The write port may be used to write a logic one (e.g., high) value into the storage latch 110 when the write word line 137 and the other of the write bit lines 135 or 136 is asserted.

The storage latch 110 may also be connected to a first read drive transistor 123 and to a second read drive transistor 124. The first read drive transistor 123 may be connected to a first read transistor 125 and the second read drive transistor 124 may be connected to a second read transistor 126. The read drive transistors 123, 124 and the read transistors 125, 126 may be NMOS transistors, as shown. The first read transistor 125 may be connected to a first read bit line (RBL1) 131 and to a first read word line (RWL1) 133. The second read transistor 126 may be connected to a second read bit line (RBL2) 132 and to a second read word line (RWL2) 134. The transistors 123 and 125 may correspond to a first read port of the bit cell 100, and the transistors 124 and 126 may correspond to a second read port of the bit cell 100. The read word lines 133 and/or 134 may be asserted during a read operation and the read ports may be complementary read ports. For example, when a data value at the first read port is logic zero, a data value at the second read port is logic one, and vice versa. In the example of FIG. 1B, the first read port (on the left) is shown as reading a logic zero value ("0") and the second read port (on the right) is shown as reading a logic one ("1") value.

The bit cell 100 may thus include two read ports and one write port, and may alternatively be referred to as a "3-port" bit cell. Because the bit cell 100 includes ten transistors, the bit cell 100 may also be referred to as a "10T" bit cell. In a particular embodiment, the bit cell 100 is included in a static random access memory (SRAM) device and provides high-speed parallel memory access. As an illustrative non-limiting example, an SRAM device that includes the bit cell 100 may be used in an L1 and/or L2 cache of a processor. The SRAM device may include one or more arrays of bit cells arranged in a grid-like fashion, including multiple rows of bit cells and multiple columns of bit cells.

As further described herein, the bit cell 100 has a height (H) and a width (W). In accordance with the described techniques, the width (W) may be approximately twice a contacted poly pitch (CPP) associated with the bit cell 100, where CPP corresponds to a distance between contacted poly (gate) lines. CPP may alternately be referred to as gate pitch. For example, CPP is the distance from an edge of a poly line to a corresponding edge of an adjacent poly line (e.g., top-edge to top-edge or bottom-edge to bottom-edge). CPP may therefore also be considered as being equal to a sum of one poly width and one poly spacing. In a 10 nm semiconductor manufacturing process (e.g., a process that has a smallest available line distance/feature size of 10 nm), CPP may be approximately equal to 60-66 nm. For comparative purposes, CPP for a 14 nm process (e.g., a process that has a smallest available line distance/feature size of 14 nm) may be approximately 80-90 nm.

To maintain a bit cell width at 2*CPP (e.g., 132 nm) or less for sub-14 nm processes (e.g., 10 nm processes or 7 nm processes) and to improve routing between different components of the bit cell, the techniques of the present disclosure (as further described with reference to FIG. 2) describe multiple bit cell rows (e.g., a first bit cell row and a second bit cell row) that share common global word lines in a single metal layer. For example, a first global read word line, a second global read word line, and a global write word line may be located in a fourth metal layer (M4). The pitch of each global word line may be approximately 80 nm. Because the width of two bit cell rows is approximately 264 nm (e.g., 2*132 nm), the three global word lines may be patterned using a width that is less than the width of two bit cells. For example, the total width occupied by the three global word lines (e.g., 3*80 nm=240 nm) is less than the width of the two bit cell rows.

Figure 2:
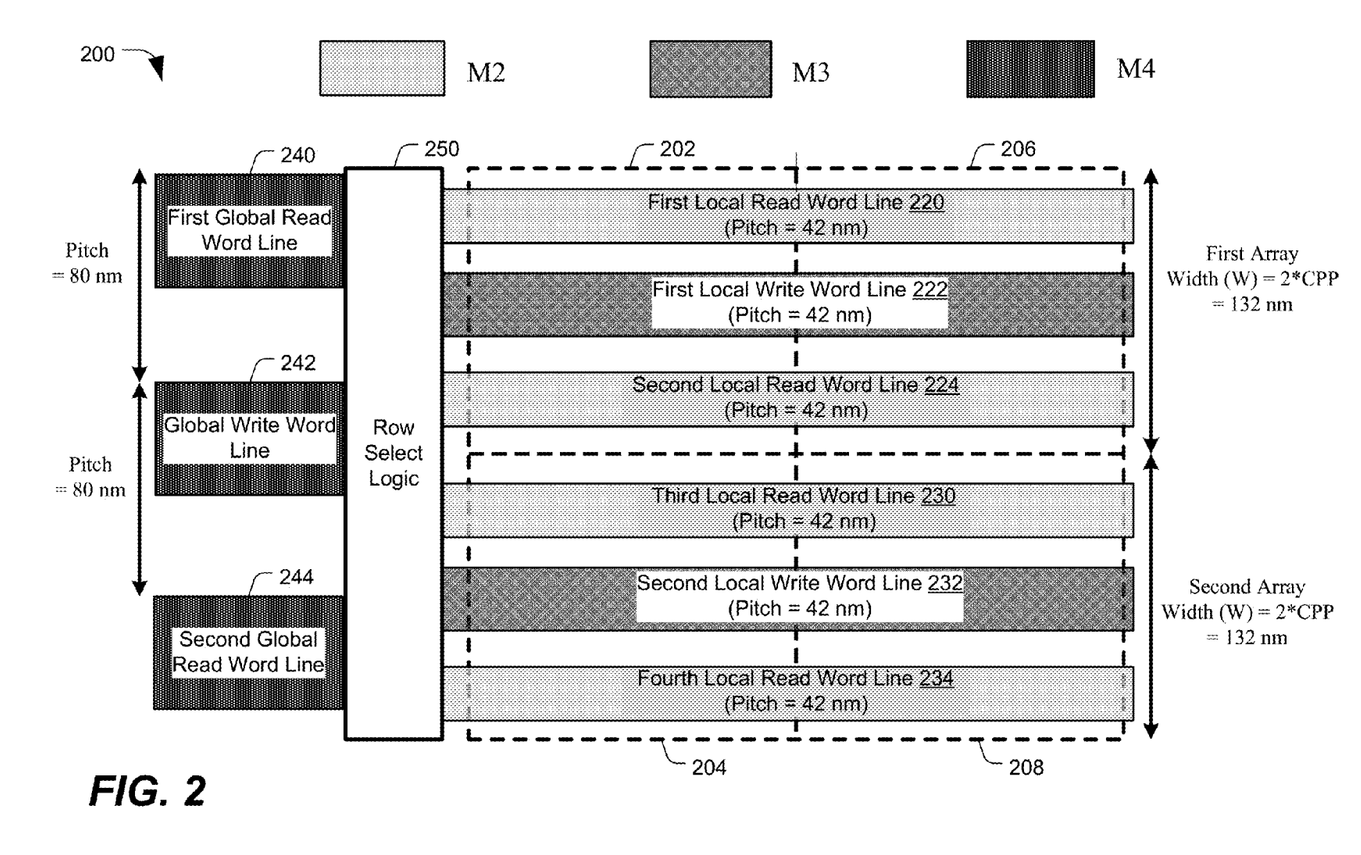
FIG. 2 is a layout diagram of a 3-port SRAM array having shared global read and write word lines.

As further described with respect to FIG. 2, selection logic may selectively couple the global word lines to the first bit cell row or to the second bit cell row. Thus, all of the global word lines may be located in a single metal layer (M4), as opposed to one global word line per metal layer, which may improve routing between different components within the bit cells. For example, a sixth metal layer (M6) and an eighth metal layer (M8) may be relatively open to routing because each global word line is in the fourth metal layer (M4). Additionally, the global word lines may have a relatively large pitch (e.g., 80 nm) which may decrease read/write latency due to decreased word line resistive-capacitive (RC) impedance.

Referring to FIG. 2, a layout diagram 200 of a 3-port SRAM array having shared global read and write word lines is shown. The layout diagram 200 includes a first bit cell 202, a second bit cell 204, a third bit cell 206, and a fourth bit cell 208. Each bit cell 202-208 may have the circuit layout shown in FIGS. 1A and 1B. The first bit cell 202 and the third bit cell 206 may be included in a first array of the 3-port SRAM array, and the second bit cell 204 and the fourth bit cell 208 may be included in a second array of the 3-port SRAM array. The first array (e.g., the first and third bit cells 202, 206) may have a width that is equal to twice the CPP of one of the bit cells 202-208, and the second array (e.g., the second and fourth bit cells 204, 208) may also have a width that is equal to twice the CPP of one of the bit cells 202-208. For example, in a 10 nm semiconductor manufacturing process, the first array and the second array may each have a width of approximately 132 nm. Thus, the combined width of the first array and the second array may be approximately equal to 264 nm.

When manufactured, the bit cells 202-208 may include various components/layers, such as fins (FinFETs including source/drain regions), transistor gates (alternatively referred to as poly lines), middle-of-line contacts (e.g., local interconnects) for transistor source/drain regions (MD), middle-of-line contacts (e.g., local interconnects) for gates/poly lines (MP), a first metal layer (M1), vias connecting MD and MP to M1 (Via0), a second metal layer (M2), vias connecting M1 to M2 (Via1), a third metal layer (M3), and vias connecting M2 to M3 (Via2).

FIG. 2 illustrates the second metal layer (M2) and the third metal layer (M3). The second metal layer (M2) may be coupled to the bit cells 202-208, and the third metal layer (M3) may be patterned above the second metal layer (M2). A first local read word line 220 may be included in the second metal layer (M2). For the bit cells 202, 206 in the first array, the first local read word line 220 may correspond to the first read word line (RWL1) 133 of FIGS. 1A and 1B. For example, the first local read word line 220 may be coupled to a gate of a transistor in the first bit cell 202 (that corresponds to the transistor 125 of FIGS. 1A and 1B) and may be coupled to a gate of a transistor in the third bit cell 206 (that corresponds to the transistor 125).

A first local write word line 222 may be included in the third metal layer (M3). For the bit cells 202, 206 in the first array, the first local write word line 222 may correspond to the write word line (WWL) 137 of FIGS. 1A and 1B. For example the first local write word line 222 may be coupled to gates of transistors in the first bit cell 202 (that correspond to the transistors 121, 122 of FIGS. 1A and 1B) and may be coupled to gates of transistors in the third bit cell 206 (that correspond to the transistors 121, 122).

A second local read word line 224 may also be included in the second metal layer (M2). For the bit cells 202, 206 in the first array, the second local read word line 224 may correspond to the second read word line (RWL2) 134 of FIGS. 1A and 1B. For example, the second local read word line 224 may be coupled to a gate of a transistor in the first bit cell 202 (that corresponds to the transistor 126 of FIGS. 1A and 1B) and may be coupled to a gate of a transistor in the third bit cell 206 (that corresponds to the transistor 126).

A third local read word line 230 may also be included in the second metal layer (M2). For the bit cells 204, 208 in the second array, the third local read word line 230 may correspond to the first read word line (RWL1) 133 of FIGS. 1A and 1B. For example, the third local read word line 230 may be coupled to a gate of a transistor in the second bit cell 204 (that corresponds to the transistor 125 of FIGS. 1A and 1B) and may be coupled to a gate of a transistor in the fourth bit cell 208 (that corresponds to the transistor 125).

A second local write word line 232 may also be included in the third metal layer (M3). For the bit cells 204, 208 in the second array, the second local write word line 232 may correspond to the write word line (WWL) 137 of FIGS. 1A and 1B. For example the second local write word line 232 may be coupled to gates of transistors in the second bit cell 204 (that correspond to the transistors 121, 122 of FIGS. 1A and 1B) and may be coupled to gates of transistors in the fourth bit cell 208 (that correspond to the transistors 121, 122).

A fourth local read word line 234 may also be included in the second metal layer (M2). For the bit cells 204, 208 in the second array, the fourth local read word line 234 may correspond to the second read word line (RWL2) 134 of FIGS. 1A and 1B. For example, the fourth local read word line 234 may be coupled to a gate of a transistor in the second bit cell 204 (that corresponds to the transistor 126 of FIGS. 1A and 1B) and may be coupled to a gate of a transistor in the fourth bit cell 208 (that corresponds to the transistor 126).

In a standard bit cell that includes a poly-gate having a length oriented in the horizontal direction, a first metal layer may have a length oriented in a vertical direction, a second metal layer may have a length oriented in a horizontal direction (as illustrated in the embodiment of FIG. 2), and a third metal layer may have a length oriented in a vertical direction. However, because the length of the third metal layer (M3) of FIG. 2 is oriented in the horizontal direction, the third metal layer (M3) is a "wrong direction layer." Thus, the pitch of the third metal layer (M3) may be approximately equal to 126 nm). Because the first metal layer (M1) (not shown) and the second metal layer (M2) of FIG. 2 are "right direction layers" (e.g., layers having lengths that are oriented in a similar direction as corresponding layers in a standard bit cell), the first metal layer (M1) and the second metal layer (M2) have a relatively low pitch (e.g., approximately equal to 42 nm).

When migrating from a 14 nm process to a 10 nm process, SADP may be preferable for patterning metal layers of the bit cells 202-208. Because SADP may be ill-suited for jogs/turns, the metal layers of the bit cells 202-208 may correspond to linear-only patterns. When using linear-only patterns at 10 nm, three independently accessible word lines (2 read word lines and 1 write word line) may be patterned in the second and third metal layers (M2, M3) for each bit cell 202-208.

As described above, the second metal layer (M2) is a "right direction layer" and has a relatively low pitch. Thus, the two read word lines (RWL1, RWL2) 133, 134 may be patterned in the second metal layer (M2) without expanding the width of the bit cells 202-208. For example, each read word line (RWL1, RWL2) 133, 134 may have a width of approximately 23 nm (satisfying the pitch requirement of the second metal layer (M2)) and may accommodate the width of the bit cells 202-208 (e.g., 2*CPP or 132 nm).

As described above, the third metal layer (M3) is a "wrong direction layer" and has a relatively high pitch. Thus, a single write word line (WWL) 137 may be patterned in the third metal layer (M3) for each bit cell 202-208 without expanding the width of the bit cells 202-208. Because a single write word line (WWL) 137 is patterned in the third metal layer (M3) (as opposed to the two read word lines (RWL1, RWL2) 133, 134 which would increase the width of the bit cells 202-208), the write word line (WWL) 137 may have a relatively large width. For example, the write word line (WWL) 137 may have a width of approximately 66 nm (satisfying the pitch requirement of the third metal layer (M3)) and may accommodate the width of the bit cells 202-208. The relatively large width of the write word line (WWL) 137 may reduce write latency for the bit cells 202-208. For example, an increased width of the write word line (WWL) 137 may reduce the RC impedance of the write word line (WWL) 137, resulting in reduced latency.

FIG. 2 also illustrates a fourth metal layer (M4). A first global read word line 240, a global write word line 242, and a second global read word line 244 may be included in the fourth metal layer (M4). The fourth metal layer (M4) may be a "right direction layer" (e.g., oriented in a similar manner as a corresponding layer in a standard bit cell) and may have a relatively low pitch requirement. For example, in a 10 nm manufacturing process, the pitch requirement for the fourth metal layer (M4) may be approximately 80 nm. Thus, the pitch of each global word line 240-244 may be approximately 80 nm. Because the combined width of the first array and the second array is approximately 264 nm (e.g., 2*132 nm), the three global word lines 240-244 may be patterned using a width that is less than the combined width of the first array and the second array. For example, the total width occupied by the three global word lines 240-244 (e.g., 3*80 nm=240 nm) is less than the combined width of the first and second array.

Row select logic 250 may be configured to control whether the global word lines 240-244 are coupled to the first array or to the second array. For example, based on a logical value (e.g., a voltage level) of a selection signal, the row select logic 250 may couple one of the global word lines 240-244 to a corresponding local word line 220-224 in the first array or to a corresponding local word line 230-234 in the second array. The operations of the row select logic 250 are described in greater detail with respect to FIG. 3.

The layout diagram 200 of FIG. 2 may provide improved routing between different components within bit cells 202-208. For example, compared to bit cell architectures that have one global word line in a fourth metal layer (M4), one global word line in a sixth metal layer (M6), and one global word line in an eighth metal layer (M8), the layout diagram 200 includes three global word lines 240-244 in the fourth metal layer (M4). Thus, the upper metal layers (e.g., the sixth metal layer (M6) and the eighth metal layer (M8)) may be relatively open to routing because the global word lines 240-244 are placed in a single metal layer (e.g., the fourth metal layer (M4)). Additionally, because the global word lines 240-244 are placed across the width of two arrays (as opposed to a typical bit cell architecture where global word lines are placed across the width of a single array), the global word lines 240-244 may have a relatively large width which may decrease read/write latency due to decreased word line RC impedance.

Figure 3:
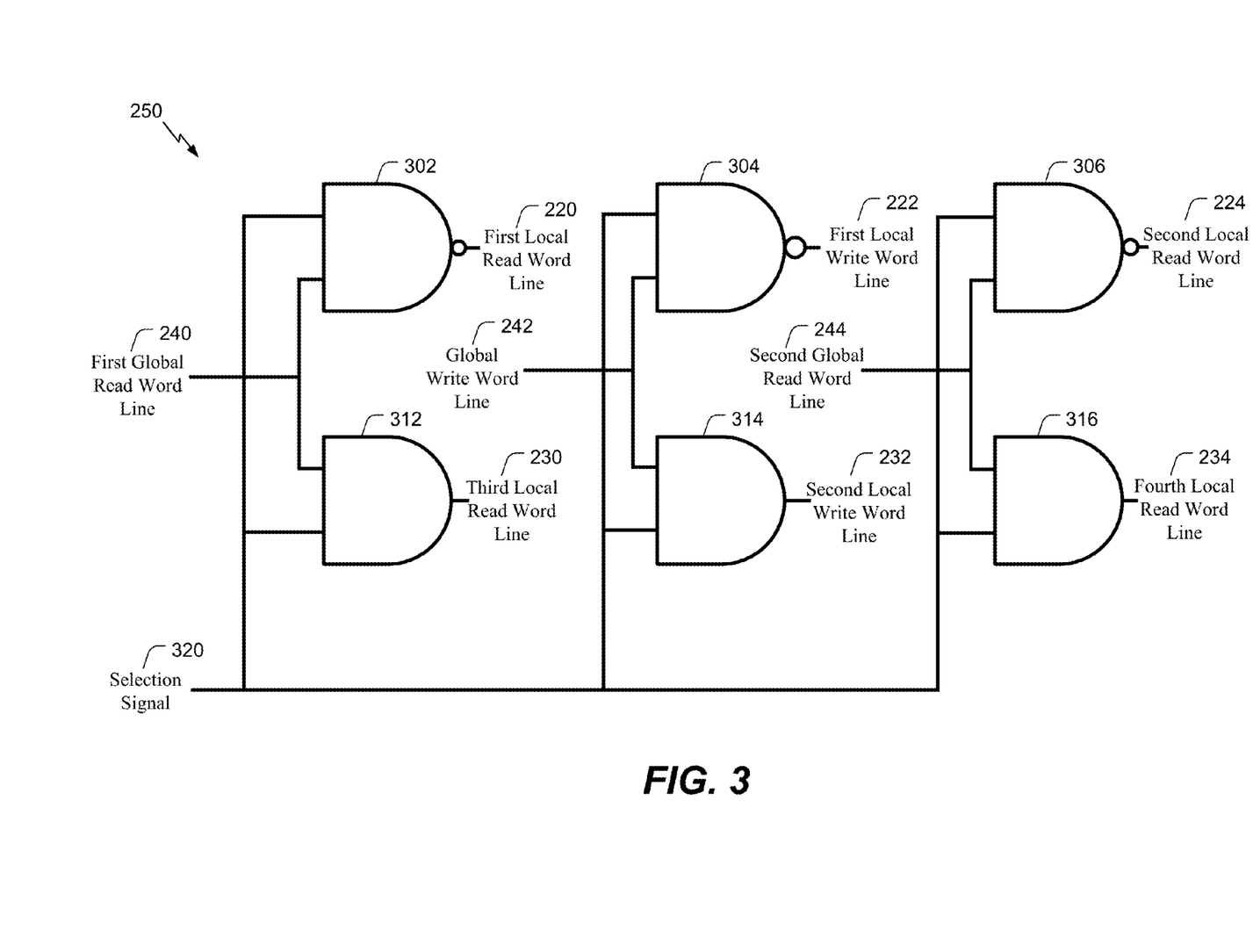
FIG. 3 is an illustrative embodiment of row select logic for a 3-port SRAM array having shared global read and write word lines.

Referring to FIG. 3, a particular illustrative embodiment of the row select logic 250 of FIG. 2 is shown. The row select logic 250 includes a first logical NAND gate 302, a second logical NAND gate 304, a third logical NAND gate 306, a first logical AND gate 312, a second logical AND gate 314, and a third logical AND gate 316.

The row select logic 250 may be configured to control whether the global word lines 240-244 are coupled to the first array of bit cells (e.g., the first and third bit cells 202, 206 of FIG. 2) or to the second array of bit cells (e.g., the second and fourth bit cells 204, 208 of FIG. 2). To illustrate, a selection signal 320 may be provided to a first input of each of the logical NAND gates 302-306 and to a second input of each of the logical AND gates 312-316. The first global read word line 240 may be coupled to a second input of the first logical NAND gate 302 and to a first input of the first logical AND gate 312. The global write word line 242 may be coupled to a second input of the second logical NAND gate 304 and to a first input of the second logical AND gate 314. The second global read word line 244 may be coupled to a second input of the third logical NAND gate 306 and to a first input of the third logical AND gate 316.

If the first global read word line 240 has a logical high voltage level and the selection signal 320 has a logical low voltage level, the first logical NAND gate 302 provides a logical high voltage level to the first local read word line 220 (e.g., to "couple" the first global read word line 240 to the first local read word line 220) and the first logical AND gate 312 provides a logical low voltage level to the third local read word line 230 (e.g., to "decouple" the first global read word line 240 from the third local read word line 230). If the first global read word line 240 has a logical high voltage level and the selection signal 320 has a logical high voltage level, the first logical NAND gate 302 provides a logical low voltage level to the first local read word line 220 (e.g., to "decouple" the first global read word line 240 from the first local read word line 220) and the first logical AND gate 312 provides a logical high voltage level to the third local read word line 230 (e.g., to "couple" the first global read word line 240 to the third local read word line 230).

If the global write word line 242 has a logical high voltage level and the selection signal 320 has a logical low voltage level, the second logical NAND gate 304 provides a logical high voltage level to the first local write word line 222 (e.g., to "couple" the global write word line 242 to the first local write word line 222) and the second logical AND gate 314 provides a logical low voltage level to the second local read word line 232 (e.g., to "decouple" the global write word line 242 from the fourth local read word line 234). If the global write word line 242 has a logical high voltage level and the selection signal 320 has a logical high voltage level, the second logical NAND gate 304 provides a logical low voltage level to the first local write word line 222 (e.g., to "decouple" the global write word line 242 from the first local write word line 222) and the second logical AND gate 314 provides a logical high voltage level to the second local write word line 232 (e.g., to "couple" the global write word line 242 to the second local write word line 232).

If the second global read word line 244 has a logical high voltage level and the selection signal 320 has a logical low voltage level, the third logical NAND gate 306 provides a logical high voltage level to the second local read word line 224 (e.g., to "couple" the second global read word line 244 to the second local read word line 224) and the third logical AND gate 316 provides a logical low voltage level to the fourth local read word line 234 (e.g., to "decouple" the second global read word line 244 from the fourth local read word line 234). If the second global read word line 244 has a logical high voltage level and the selection signal 320 has a logical high voltage level, the third logical NAND gate 306 provides a logical low voltage level to the second local read word line 224 (e.g., to "decouple" the second global read word line 244 from the second local read word line 224) and the third logical AND gate 316 provides a logical high voltage level to the fourth local read word line 234 (e.g., to "couple" the second global read word line 244 to the fourth local read word line 234).

The row select logic 250 may enable the global word lines 240-244 to be selectively coupled to the respective local word lines 220-224, 230-224. The row select logic 250 may enable the global word lines 240-244 to be placed in the fourth metal layer (M4) as opposed to three distinct metal layers (e.g., the fourth metal layer (M4), the sixth metal layer (M6), and the eighth metal layer (M8)). Thus, the upper metal layers (e.g., the sixth metal layer (M6) and the eighth metal layer (M8)) may be relatively open to routing because the global word lines 240-244 are placed in a single metal layer (e.g., the fourth metal layer (M4)). Thus, the row select logic 250 may also enable the global word lines 240-244 to have a relatively large width which may decrease read/write latency due to decreased word line RC impedance.

Figure 4:
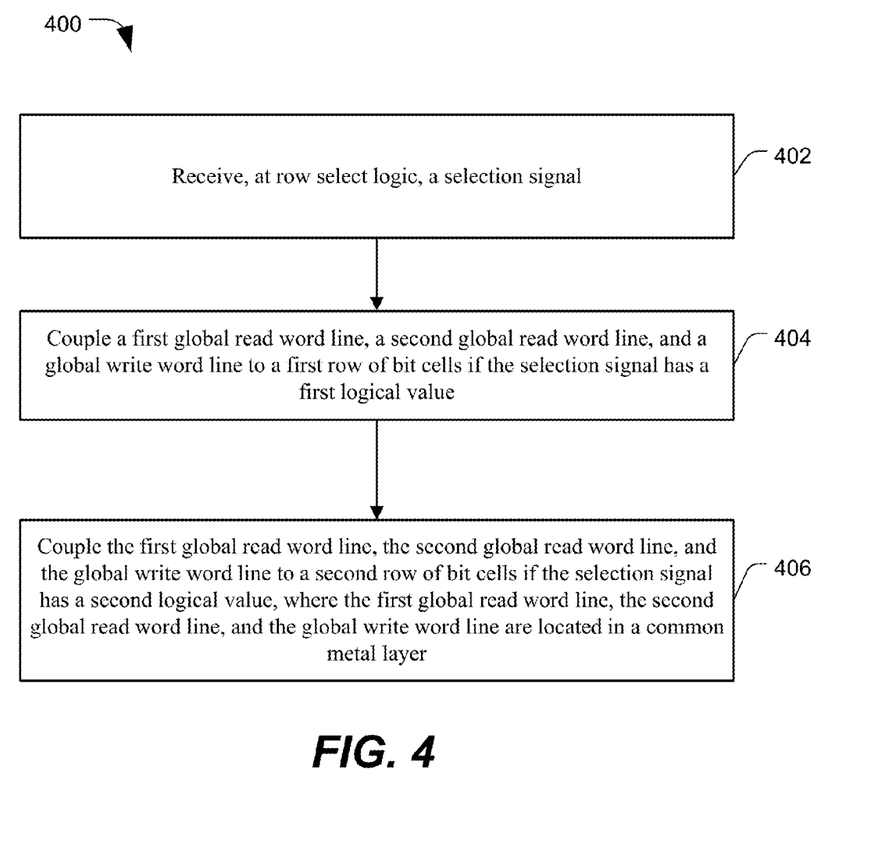
FIG. 4 is a flowchart of a particular illustrative embodiment of a method of operating a 3-port SRAM array having shared global read and write word lines.

Referring to FIG. 4, a flowchart of a particular illustrative embodiment of a method 400 of operating a 3-port SRAM array having shared global read and write word lines is shown. The method may be performed using the row select logic 250 of FIGS. 2 and 3.

The method 400 includes receiving a selection signal, at 402. For example, referring to FIG. 3, the row select logic 250 may receive the selection signal 320. The selection signal 320 may be provided to a first input of each of the logical NAND gates 302-306 and to a second input of each of the logical AND gates 312-316.

A first global read word line, a second global read word line, and a global write word line may be coupled to a first row of bit cells if the selection signal has a first logical value, at 404. For example, referring to FIGS. 2 and 3, if the first global read word line 240 has a logical high voltage level and the selection signal 320 has a logical low voltage level, the first logical NAND gate 302 provides a logical high voltage level to the first local read word line 220 (e.g., to "couple" the first global read word line 240 to the first local read word line 220) and the first logical AND gate 312 provides a logical low voltage level to the third local read word line 230 (e.g., to "decouple" the first global read word line 240 from the third local read word line 230). The first local read word line 220 is coupled to the first row of bit cells (e.g., the first array of bit cells in FIG. 2).

As another example, if the global write word line 242 has a logical high voltage level and the selection signal 320 has a logical low voltage level, the second logical NAND gate 304 provides a logical high voltage level to the first local write word line 222 (e.g., to "couple" the global write word line 242 to the first local write word line 222) and the second logical AND gate 314 provides a logical low voltage level to the second local read word line 232 (e.g., to "decouple" the global write word line 242 from the fourth local read word line 234). The first local write word line 222 is coupled to the first row of bit cells (e.g., the first array of bit cells in FIG. 2). As another example, if the second global read word line 244 has a logical high voltage level and the selection signal 320 has a logical low voltage level, the third logical NAND gate 306 provides a logical high voltage level to the second local read word line 224 (e.g., to "couple" the second global read word line 244 to the second local read word line 224) and the third logical AND gate 316 provides a logical low voltage level to the fourth local read word line 234 (e.g., to "decouple" the second global read word line 244 from the fourth local read word line 234). The second local read word line 224 is coupled to the first row of bit cells (e.g., the first array of bit cells in FIG. 2).

The first global read word line, the second global read word line, and the global write word line may be coupled to a second row of bit cells if the section signal has a second logical value, at 406. For example, referring to FIGS. 2 and 3, if the first global read word line 240 has a logical high voltage level and the selection signal 320 has a logical high voltage level, the first logical NAND gate 302 provides a logical low voltage level to the first local read word line 220 (e.g., to "decouple" the first global read word line 240 from the first local read word line 220) and the first logical AND gate 312 provides a logical high voltage level to the third local read word line 230 (e.g., to "couple" the first global read word line 240 to the third local read word line 230). The third local read word line 230 is coupled to the second row of bit cells (e.g., the second array of bit cells in FIG. 2).

As another example, if the global write word line 242 has a logical high voltage level and the selection signal 320 has a logical high voltage level, the second logical NAND gate 304 provides a logical low voltage level to the first local write word line 222 (e.g., to "decouple" the global write word line 242 from the first local write word line 222) and the second logical AND gate 314 provides a logical high voltage level to the second local write word line 232 (e.g., to "couple" the global write word line 242 to the second local write word line 232). The second local write word line 232 is coupled to the second row of bit cells (e.g., the second array of bit cells in FIG. 2). As another example, if the second global read word line 244 has a logical high voltage level and the selection signal 320 has a logical high voltage level, the third logical NAND gate 306 provides a logical low voltage level to the second local read word line 224 (e.g., to "decouple" the second global read word line 244 from the second local read word line 224) and the third logical AND gate 316 provides a logical high voltage level to the fourth local read word line 234 (e.g., to "couple" the second global read word line 244 to the fourth local read word line 234). The fourth local read word line 234 is coupled to the second row of bit cells (e.g., the second array of bit cells in FIG. 2).

The first global read word line 240, the global write word line 242, and the second global read word line 244 are located in a common metal layer (e.g., the fourth metal layer (M4) of FIG. 2). Thus, the method 400 of FIG. 4 may provide a technique for coupling the global word lines 240-244 to the respective local word lines 220-224, 230-234 so that the global word lines 240-244 may be placed in the common metal layer.

Figure 5:
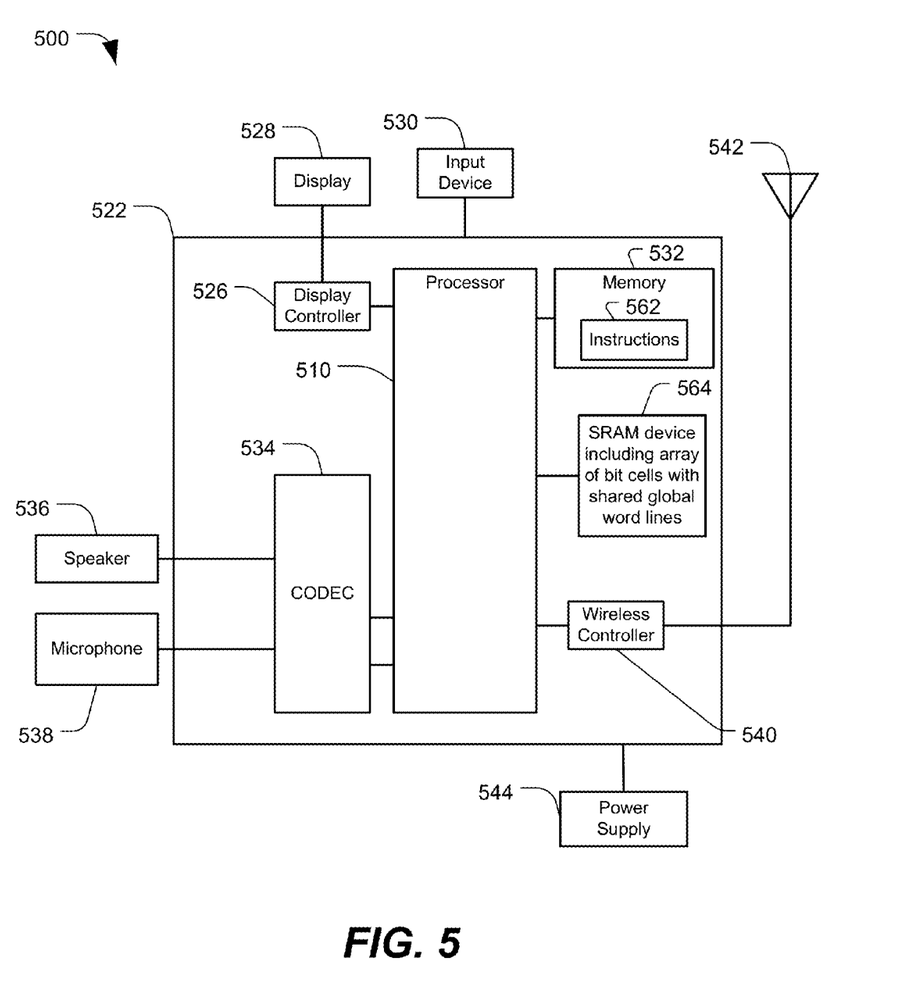
FIG. 5 is a block diagram of an electronic device including a 3-port SRAM array having shared global read and write word lines.

Referring to FIG. 5, a block diagram of a particular illustrative embodiment of an electronic device is depicted and generally designated 500. The electronic device 500 includes a processor 510, such as a digital signal processor (DSP) or a central processing unit (CPU), coupled to a memory 532.

The processor 510 may be coupled to an SRAM device 564 that includes an array of bit cells with shared global word lines. For example, the SRAM device 564 may include the bit cells 202-208 of FIG. 2 and may include the metal layer configuration as described with respect to FIG. 2. In a particular embodiment, the SRAM device 564 may also include the row select logic 250 of FIGS. 2-3. In another particular embodiment, functions of the row select logic 250 may be implemented by the processor 510. It should be noted that although FIG. 5 illustrates use of the SRAM device 564 coupled to the processor 510, this is not to be considered limiting. SRAM devices in accordance with the present disclosure, such as the SRAM device 564, may be included in any type of memory of any type of electronic device.

FIG. 5 shows a display controller 526 that is coupled to the processor 510 and to a display 528. A coder/decoder (CODEC) 534 can also be coupled to the processor 510. A speaker 536 and a microphone 538 can be coupled to the CODEC 534. FIG. 5 also indicates that a wireless controller 540 can be coupled to the processor 510 and to an antenna 542. In a particular embodiment, the processor 510, the display controller 526, the memory 532, the CODEC 534, and the wireless controller 540 are included in a system-in-package or system-on-chip device (e.g., mobile station modem (MSM)) 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller.

Although the SRAM device 564 is depicted in the wireless device 500 of FIG. 5, in other embodiments, the SRAM device 564 may be included in other devices. As non-limiting examples, the SRAM device 564 may be included in a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, or any other device.

In conjunction with the described embodiments, an apparatus includes first means for performing a read operation configured to be selectively coupled to a first row of bit cells and to a second row of bit cells. For example, the first means for performing the read operation may include the first global read word line 240 of FIGS. 2-3, the SRAM device 564 of FIG. 5, one or more other devices configured to perform the read operation, or any combination thereof.

The apparatus also includes second means for performing the read operation configured to be selectively coupled to the first row of bit cells and to the second row of bit cells. For example, the second means for performing the read operation may include the second global read word line 244 of FIGS. 2-3, the SRAM device 564 of FIG. 5, one or more other devices configured to perform the read operation, or any combination thereof.

The apparatus also include means for performing a write operation configured to be selectively coupled to the first row of bit cells and to the second row of bit cells. For example, the means for performing the writer operation may include the global write word line 242 of FIGS. 2-3, the SRAM device 564 of FIG. 5, one or more other devices configured to perform the write operation, or any combination thereof. The first means for performing the read operation, the second means for performing the read operation, and the means for performing the write operation may be located in a common metal layer (e.g., the fourth metal layer (M4) of FIG. 2).

Figure 6:
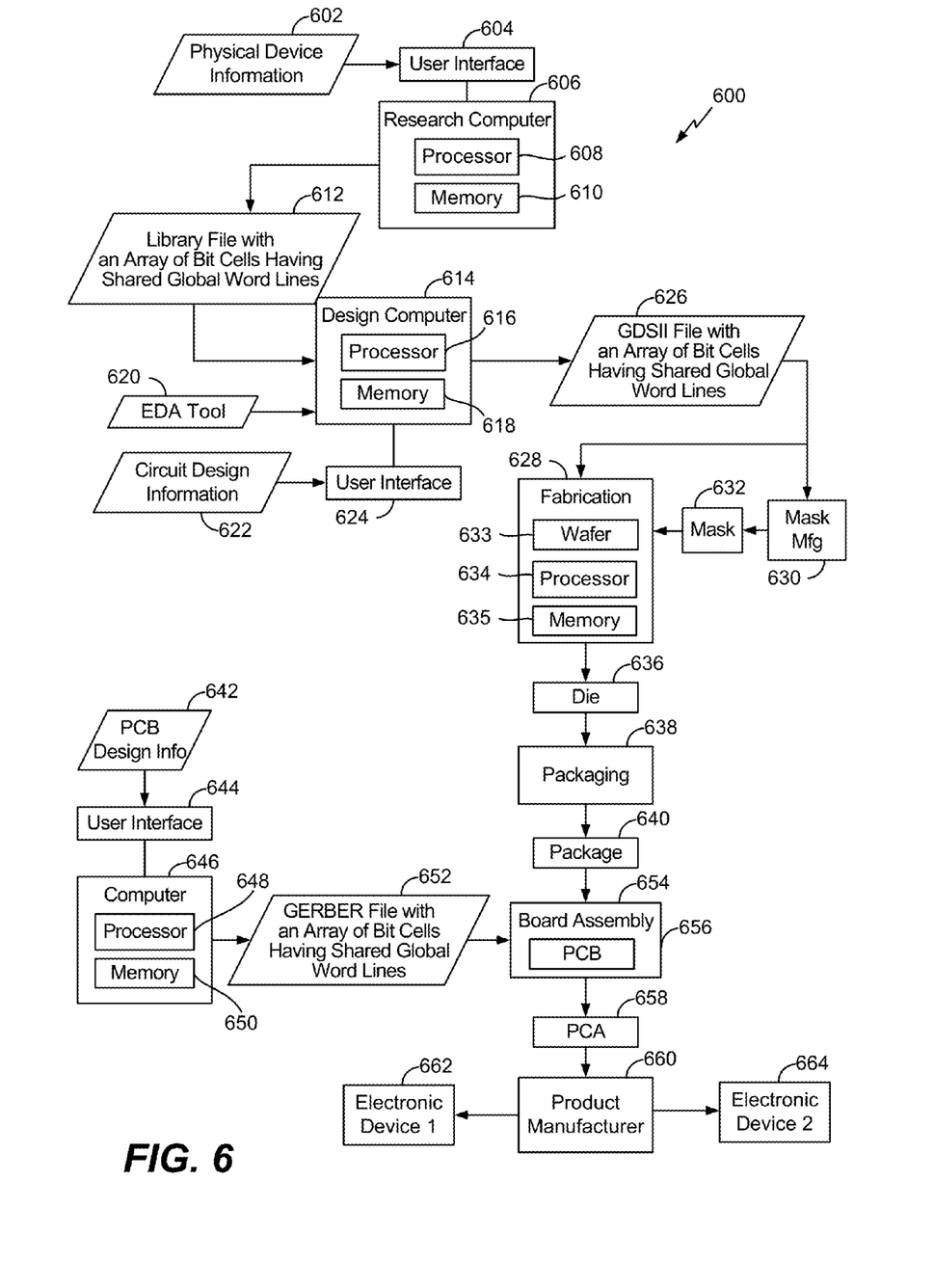
FIG. 6 is a data flow diagram of a particular illustrative embodiment of a manufacturing process to manufacture electronic devices that include a 3-port SRAM array having shared global read and write word lines.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips may be employed in electronic devices. FIG. 6 depicts a particular illustrative embodiment of an electronic device manufacturing process 600. For example, the manufacturing process 600 may be used to manufacture electronic devices that include an array of bit cells according to the shared global word line techniques described with respect to FIGS. 2-3.

Physical device information 602 is received at the manufacturing process 600, such as at a research computer 606. The physical device information 602 may include design information representing at least one physical property of an array of bit cells according to the shared global word line techniques described with respect to FIGS. 2-3. For example, the physical device information 602 may include physical parameters, material characteristics, and structure information that is entered via a user interface 604 coupled to the research computer 606. The research computer 606 includes a processor 608, such as one or more processing cores, coupled to a computer-readable medium (e.g., a non-transitory computer-readable medium), such as a memory 610. The memory 610 may store computer-readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of bit cells, including an array of bit cells according to the shared global word line techniques described with respect to FIGS. 2-3, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including an array of bit cells according to the shared global word line techniques described with respect to FIGS. 2-3, of the library file 612. For example, a user of the design computer 614 may enter circuit design information 622 via a user interface 624 coupled to the design computer 614. The circuit design information 622 may include design information representing at least one physical property of an array of bit cells according to the shared global word line techniques described with respect to FIGS. 2-3. To illustrate, the circuit design property may include identification of particular circuits and relationships to other elements in a circuit design, positioning information, feature size information, interconnection information, or other information representing a physical property of an array of bit cells according to the shared global word line techniques described with respect to FIGS. 2-3.

The design computer 614 may be configured to transform the design information, including the circuit design information 622, to comply with a file format. To illustrate, the file format may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing an array of bit cells according to the shared global word line techniques described with respect to FIGS. 2-3, in addition to other circuits or information. To illustrate, the data file may include information corresponding to a system-on-chip (SOC) that includes an array of bit cells according to the shared global word line techniques described with respect to FIGS. 2-3, and that also includes additional electronic circuits and components within the SOC.

The GDSII file 626 may be received at a fabrication process 628 to manufacture an array of bit cells according to the shared global word line techniques described with respect to FIGS. 2-3, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 633, which may be tested and separated into dies, such as a representative die 636. The die 636 includes a circuit including a device that includes an array of bit cells according to the shared global word line techniques described with respect to FIGS. 2-3.

For example, the fabrication process 628 may include a processor 634 and a memory 635 to initiate and/or control the fabrication process 628. The memory 635 may include executable instructions such as computer-readable instructions or processor-readable instructions. The executable instructions may include one or more instructions that are executable by a computer such as the processor 634.

The fabrication process 628 may be implemented by a fabrication system that is fully automated or partially automated. For example, the fabrication process 628 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular embodiment, the fabrication process 628 corresponds to a semiconductor manufacturing process associated with a technology node smaller than 14 nm (e.g., 10 nm, 7 nm, etc.). The specific process or combination of processes used to manufacture a device (e.g., including an array of bit cells according to the shared global word line techniques described with respect to FIGS. 2-3) may be based on design constraints and available materials/equipment. Thus, in particular embodiments, different processes may be used than described herein during manufacture of the device.

The fabrication system (e.g., an automated system that performs the fabrication process 628) may have a distributed architecture (e.g., a hierarchy). For example, the fabrication system may include one or more processors, such as the processor 634, one or more memories, such as the memory 635, and/or controllers that are distributed according to the distributed architecture. The distributed architecture may include a high-level processor that controls or initiates operations of one or more low-level systems. For example, a high-level portion of the fabrication process 628 may include one or more processors, such as the processor 634, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 634.

Alternatively, the processor 634 may be a part of a high-level system, subsystem, or component of the fabrication system. In another embodiment, the processor 634 includes distributed processing at various levels and components of a fabrication system.

The executable instructions included in the memory 635 may enable the processor 634 to form (or initiate formation of) an array of bit cells according to the shared global word line techniques described with respect to FIGS. 2-3. The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including an array of bit cells according to the shared global word line techniques described with respect to FIGS. 2-3.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including an array of bit cells according to the shared global word line techniques described with respect to FIGS. 2-3. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. For example, the first representative electronic device 662, the second representative electronic device 664, or both, may include or correspond to the electronic device 500 of FIG. 5, or a component thereof, such as the SRAM device 564. As an illustrative, non-limiting example, the first representative electronic device 662, the second representative electronic device 664, or both, may include a communications device, a fixed location data unit, a mobile location data unit, a mobile phone, a cellular phone, a satellite phone, a computer, a tablet, a portable computer, a processor (or other electronic device) within a vehicle, or a desktop computer. Alternatively or additionally, the first representative electronic device 662, the second representative electronic device 664, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which an array of bit cells according to the shared global word line techniques described with respect to FIGS. 2-3, is integrated. As another illustrative, non-limiting example, one or more of the electronic devices 662 and 664 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these illustrated units. Embodiments of the disclosure may be suitably employed in any device which includes active integrated circuitry including memory and on-chip circuitry.

A device that includes an array of bit cells according to the shared global word line techniques described with respect to FIGS. 2-3, may be fabricated, processed, and incorporated into an electronic device, as described in the illustrative process 600. One or more aspects of the embodiments disclosed with respect to FIGS. 1A-6 may be included at various processing stages, such as within the library file 612, the GDSII file 626 (e.g., a file having a GDSII format), and the GERBER file 652 (e.g., a file having a GERBER format), as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Although one or more of FIGS. 1A-6 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry. One or more functions or components of any of FIGS. 1A-6 as illustrated or described herein may be combined with one or more other portions of another of FIGS. 1A-6. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
an array of bit cells comprising a first row of bit cells and a second row of bit cells;
a first global read word line configured to be selectively coupled to the first row of bit cells and to the second row of bit cells; and
a second global read word line configured to be selectively coupled to the first row of bit cells and to the second row of bit cells;
wherein the first global read word line and the second global read word line are located in a common metal layer.

2. The apparatus of claim 1, further comprising a global write word line configured to be selectively coupled to the first row of bit cells and to the second row of bit cells, wherein the global write word line is located in the common metal layer.

3. The apparatus of claim 2, further comprising row select logic that is configured to:
receive a selection signal;
couple the first global read word line, the second global read word line, and the global write word line to the first row of bit cells if the selection signal has a first logical value; and
couple the first global read word line, the second global read word line, and the global write word line to the second row of bit cells if the selection signal has a second logical value.

4. The apparatus of claim 1, wherein the common metal layer is a fourth metal layer.

5. The apparatus of claim 1, wherein the array of bit cells is manufactured using a semiconductor manufacturing process of less than 14 nanometers (nm).

6. The apparatus of claim 5, wherein the semiconductor manufacturing process is a 10 nm process.

7. The apparatus of claim 6, wherein a pitch of the first global read word line is approximately 80 nm, wherein a pitch of the second global read word line is approximately 80 nm, and wherein a pitch of a global write word line is approximately 80 nm.

8. The apparatus of claim 5, wherein the semiconductor manufacturing process is a 7 nm process.

9. The apparatus of claim 2, further comprising:
a first local read word line coupled to the first row of bit cells, the first local read word line formed in a second metal layer;
a second local read word line coupled to the first row of bit cells, the second local read word line formed in the second metal layer; and
a first local write word line coupled to the first row of bit cells, the first local write word line formed in a third metal layer.

10. The apparatus of claim 9, further comprising:
a third local read word line coupled to the second row of bit cells, the third local read word line formed in the second metal layer;
a fourth local read word line coupled to the second row of bit cells, the fourth local read word line formed in the second metal layer; and
a second local write word line coupled to the second row of bit cells, the second local write word line formed in the third metal layer.

11. The apparatus of claim 1, wherein the first row of bit cells includes a three-port static random access memory (SRAM) bit cell.

12. A method comprising:
receiving, at row select logic, a selection signal;
coupling a first global read word line and a second global read word line to a first row of bit cells if the selection signal has a first logical value; and
coupling the first global read word line and the second global read word line to a second row of bit cells if the selection signal has a second logical value;
wherein the first global read word line and the second global read word line are located in a common metal layer.

13. The method of claim 12, further comprising:
coupling a global write word line to the first row of bit cells if the selection signal has the first logical value; and
coupling the global write word line to the second row of bit cells if the selection signal has the second logical value;
wherein the global write word line is located in the common metal layer.

14. The method of claim 12, wherein the common metal layer is a fourth metal layer.

15. The method of claim 12, wherein the first row of bit cells and the second row of bit cells are manufactured using a semiconductor manufacturing process of less than 14 nanometers (nm).

16. The method of claim 15, wherein the semiconductor manufacturing process is a 7 nm process or a 10 nm process.

17. A non-transitory computer-readable medium comprising instructions that, when executed by a processor, cause the processor to:
   initiate coupling a first global read word line and a second global read word line to a first row of bit cells if a received selection signal has a first logical value; and
   initiate coupling the first global read word line and the second global read word line to a second row of bit cells if the received selection signal has a second logical value;
   wherein the first global read word line and the second global read word line are located in a common metal layer.

18. The non-transitory computer-readable medium of claim 17, further comprising instructions that, when executed by the processor, cause the processor to:
   initiate coupling a global write word line to the first row of bit cells if the received selection signal has the first logical value; and
   initiate coupling the global write word line to the second row of bit cells if the received selection signal has the second logical value;
   wherein the global write word line is located in the common metal layer.

19. The non-transitory computer-readable medium of claim 17, wherein the common metal layer is a fourth metal layer.

20. The non-transitory computer-readable medium of claim 17, wherein the first row of bit cells and the second row of bit cells are manufactured using a manufacturing process of less than 14 nanometers (nm).

21. The non-transitory computer-readable medium of claim 17, wherein the first row of bit cells includes a three-port static random access memory (SRAM) bit cell.

22. The non-transitory computer-readable medium of claim 21, wherein the three-port SRAM bit cell includes a first read port, a second read port, and a write port, wherein a first local read word line couples the first global read word line to the first read port, wherein a second local read word line couples the second global read word line to the second read port, and wherein a local write word line couples a global write word line to the write port, and wherein the first local read word line and the second local read word line are located in a second metal layer, and wherein the local write word line is located in a third metal layer.

23. An apparatus comprising:
   first means for performing a read operation configured to be selectively coupled to a first row of bit cells and to a second row of bit cells; and
   second means for performing the read operation configured to be selectively coupled to the first row of bit cells and to the second row of bit cells;
   wherein the first means for performing the read operation and the second means for performing the read operation are located in a common metal layer.

24. The apparatus of claim 23, further comprising means for performing a write operation configured to be selectively coupled to the first row of bit cells and to the second row of bit cells, wherein the means for performing the write operation is located in the common metal layer.

25. The apparatus of claim 23, wherein the common metal layer is a fourth metal layer.

26. The apparatus of claim 24, wherein the first row of bit cells includes a three-port static random access memory (SRAM) bit cell.

27. The apparatus of claim 26, wherein the three-port SRAM bit cell includes a first read port, a second read port, and a write port.

28. The apparatus of claim 27, wherein a first local read word line couples the first means for performing the read operation to the first read port, wherein a second local read word line couples the second means for performing the read operation to the second read port, and wherein a local write word line couples the means for performing the write operation to the write port.

29. The apparatus of claim 1, wherein the array of bit cells, the first global read word line, and the second global read word line are integrated in a static random access memory (SRAM) device, and wherein the SRAM device is integrated in a mobile communication device.

30. The apparatus of claim 1, wherein the array of bit cells, the first global read word line, and the second global read word line are integrated in a static random access memory (SRAM) device, and wherein the SRAM device is integrated in a fixed location communication unit.

* * * * *